(12) United States Patent
Kim

(10) Patent No.: US 9,887,353 B2
(45) Date of Patent: Feb. 6, 2018

(54) ELECTRONIC DEVICE AND METHOD FOR FABRICATING THE SAME

(71) Applicant: SK hynix Inc., Icheon (KR)

(72) Inventor: Wan-Gee Kim, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/293,079

(22) Filed: Oct. 13, 2016

(65) Prior Publication Data

US 2017/0309815 A1  Oct. 26, 2017

(30) Foreign Application Priority Data

Apr. 26, 2016  (KR) .................. 10-2016-0050568

(51) Int. Cl.
*H01L 45/00* (2006.01)
*H01L 27/24* (2006.01)

(52) U.S. Cl.
CPC ........ *H01L 45/124* (2013.01); *H01L 27/2472* (2013.01); *H01L 45/1233* (2013.01); *H01L 45/1253* (2013.01); *H01L 45/141* (2013.01); *H01L 45/145* (2013.01); *H01L 45/1641* (2013.01); *H01L 45/1675* (2013.01); *H01L 45/1683* (2013.01); *H01L 27/2427* (2013.01); *H01L 27/2463* (2013.01); *H01L 45/04* (2013.01); *H01L 45/122* (2013.01)

(58) Field of Classification Search
CPC ......... H01L 45/04; H01L 45/06; H01L 45/10; H01L 45/12; H01L 45/122; H01L 45/1233; H01L 45/124; H01L 45/14; H01L 45/141; H01L 45/148; H01L 45/145; H01L 45/1675; H01L 45/1683; H01L 27/2409; H01L 27/2418; H01L 27/2427; H01L 27/2463; H01L 27/2472
See application file for complete search history.

(56) References Cited

U.S. PATENT DOCUMENTS

| 8,722,455 | B2 | 5/2014 | Song et al. | |
|---|---|---|---|---|
| 9,130,166 | B2* | 9/2015 | Lin | H01L 23/53228 |
| 2006/0113520 | A1* | 6/2006 | Yamamoto | H01L 45/06 257/3 |
| 2009/0225588 | A1* | 9/2009 | Czubatyj | H01L 45/06 365/163 |
| 2013/0122651 | A1* | 5/2013 | Fujii | H01L 27/101 438/104 |

\* cited by examiner

*Primary Examiner* — Eduardo A Rodela

(57) ABSTRACT

An electronic device includes a semiconductor memory that includes: a first conductive pattern disposed over a substrate; a first selection element layer disposed over the first conductive pattern and having one or more first grooves therein, the first grooves overlapping the first conductive pattern; a first variable resistance layer whose sidewalls and bottom are surrounded by the first selection element layer, the first variable resistance layer being buried in the first groove; and a second conductive pattern that overlaps the first variable resistance layer and is disposed over the first variable resistance layer.

20 Claims, 13 Drawing Sheets

ND METHOD FOR
ELECTRONIC DEVICE AND METHOD FOR FABRICATING THE SAME

CROSS-REFERENCE TO RELATED APPLICATIONS

The present application claims priority of Korean Patent Application No. 10-2016-0050568, entitled "ELECTRONIC DEVICE AND METHOD FOR FABRICATING THE SAME" and filed on Apr. 26, 2016, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device whose fabrication processes may be simplified and memory cells may have improved characteristics, and a method for fabricating the electronic device.

In an implementation, an electronic device may be provided. The electronic device may include a semiconductor memory. The semiconductor memory may include: a first conductive pattern disposed over a substrate; a first selection element layer disposed over the first conductive pattern and having one or more first grooves therein, the first grooves overlapping the first conductive pattern; a first variable resistance layer whose sidewalls and bottom are surrounded by the first selection element layer, the first variable resistance layer being buried in the first groove; and a second conductive pattern that overlaps the first variable resistance layer and is disposed over the first variable resistance layer.

Implementations of the above device may include one or more the following.

The first selection element layer includes a first part and a second part other than the first part, the first part being disposed directly below the first groove and having a selection element characteristic, the second part having an insulation characteristic. The first selection element layer includes a first part and a second part other than the first part, the first part being disposed directly below the first groove and having a smaller thickness than a thickness of the second part. The semiconductor memory further includes a first conductive material layer, the first conductive material layer being disposed between the bottom of the first variable resistance layer and a part of the first selection element layer that is disposed directly below the first groove. The semiconductor memory further includes an insulating spacer that is disposed in the first groove between the sidewalls of the first variable resistance layer and sidewalls of the first selection element layer. The first selection element layer includes a first part and a second part other than the first part, the first part being disposed directly below the first groove, the second part further including an impurity that increases a resistance of the second part of the first selection element layer. The impurity exists in a region of the second part, a bottom of the second part having a height level that is equal to or greater than a height level of a bottom of the first groove. The first selection element layer includes a chalcogenide-based material, and the impurity includes oxygen or silicon. The first conductive pattern includes a first conductive line extending in a first direction, and the second conductive pattern includes a second conductive line extending in a second direction crossing the first direction, the first and second directions being parallel to a surface of the substrate, and the first groove overlaps a cross-point region of the first conductive line and the second conductive line. At least one of the first and second conductive patterns includes carbon. The first conductive material layer includes carbon. The first variable resistance layer is buried in a lower portion of the first groove, and wherein the semiconductor memory further includes a second conductive material layer that fills a remaining portion of the first groove where the first variable resistance layer is formed. The second conductive material layer includes carbon. The second conductive pattern has a width of completely covering an upper side of the first variable resistance layer. The semiconductor memory further includes: a second selection element layer disposed over the second conductive pattern and having one or more second grooves, the second grooves overlapping the second conductive pattern; a second variable resistance layer whose side-walls and bottom are surrounded by the second selection element layer, the second variable resistance layer being buried in the second groove; and a third conductive pattern that overlaps the second variable resistance layer and is disposed over the second variable resistance layer. The first conductive pattern and the third conductive pattern include a first conductive line and a third conductive line extending in a first direction, respectively, and the second conductive pattern includes a second conductive line extending in a second direction crossing the first direction, the first and second directions being parallel to a surface of the substrate, and the first groove overlaps a cross-point region of the first conductive line and the second conductive line, and the second groove overlaps a cross-point region of the second conductive line and the third conductive line. The first selection element layer includes a first sub-selection element layer and a second sub-selection element layer disposed over the first sub-selection element layer, wherein the semiconductor memory further includes a material layer, the material layer being disposed between the first sub-selection element layer and the second sub-selection element layer and having a different etch rate from the first sub-selection element layer and the second sub-selection element layer, and wherein sidewalls of the first groove are surrounded by the material layer and the second sub-selection element layer, and a top surface of the first sub-selection element layer is exposed in the first groove. A first part of the first sub-selection element layer has a selection element characteristic, and a second part of the first sub-selection element layer and the second sub-selection element layer have an insulation characteristic, the first part overlapping the first groove, and the second part being other than the first part.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In an embodiment, a method for fabricating an electronic device including a semiconductor memory may be provided. The method may include: forming a first conductive pattern over a substrate; forming a first selection element layer over the first conductive pattern; forming a first groove by selectively etching the first selection element layer, wherein the first selection element layer is selectively etched until a first part of the first selection element layer that is disposed directly below the first groove has a predetermined thickness; forming a first variable resistance layer in the first groove; and forming a second conductive pattern over the first variable resistance layer.

Implementations of the above method may include one or more the following.

The first part of the first selection element layer, which is disposed directly below the first groove, has a selection element characteristic, and a second part of the first selection element layer other than the first part has an insulation characteristic. The method further comprising: forming a first conductive material layer over the first part of the first selection element layer in the first groove before forming the first variable resistance layer. The method further comprising: forming an insulating spacer over side-walls of the first groove before forming the first variable resistance layer. The method further comprising: implanting an impurity for increasing resistance of the first selection element layer into a second part of the first selection element layer after forming the first groove, the second part of the first selection element layer being other than the first part. The implanting of the impurity is carried out while a mask pattern covering a region overlapping the first groove is disposed over the first selection element layer. The impurity is implanted into a region whose bottom has a height level equal to or greater than a height level of a bottom of the first groove. The first selection element layer includes a chalcogenide-based material, and the impurity includes oxygen or silicon. The forming of the first conductive pattern includes forming a first conductive line extending in a first direction, and wherein forming the second conductive pattern includes forming a second conductive line extending in a second direction crossing the first direction, the first and second directions being parallel to a surface of the substrate. At least one of the first conductive pattern and the second conductive pattern includes carbon. The first conductive material layer includes carbon. Forming the first variable resistance layer includes burying the first variable resistance layer in a lower portion of the first groove, the method further comprising: forming a second conductive material layer filling a remaining portion of the first groove where the first variable resistance layer is formed. The second conductive material layer includes carbon. Forming the second conductive pattern includes: forming a conductive material over the first variable resistance layer and the first selection element layer; and forming the second conductive pattern having a width of completely covering an upper side of the first variable resistance layer by selectively etching the conductive material. The method further comprising, after the forming of the second conductive pattern: forming a second selection element layer over the second conductive pattern; forming a second groove by selectively etching the second selection element layer, wherein the second selection element layer is selectively etched until a first part of the second selection element layer that is disposed directly below the second groove has a predetermined thickness; forming a second variable resistance layer in the second groove; and forming a third conductive pattern over the second variable resistance layer. The first conductive pattern and the third conductive pattern include a first conductive line and a third conductive line extending in a first direction, respectively, and the second conductive pattern includes a second conductive line extending in a second direction crossing the first direction, the first and second directions being parallel to a surface of the substrate, and the first groove overlaps a cross-point region of the first conductive line and the second conductive line, and the second groove overlaps a cross-point region of the second conductive line and the third conductive line. The first selection element layer includes a first sub-selection element layer and a second sub-selection element layer disposed over the first sub-selection element layer, the method further comprising: forming an etch stop layer between the first sub-selection element layer and the second sub-selection element layer, and wherein the forming of the first groove includes: selectively etching the second sub-selection element layer; and removing the etch stop layer exposed by selectively etching the second sub-selection element layer. The etch stop layer has a different etch rate from the first and second sub-selection element layers.

These and other aspects, implementations and associated advantages are described in greater detail in the drawings, the description and the claims.

DETAILED DESCRIPTION

Figure 1:
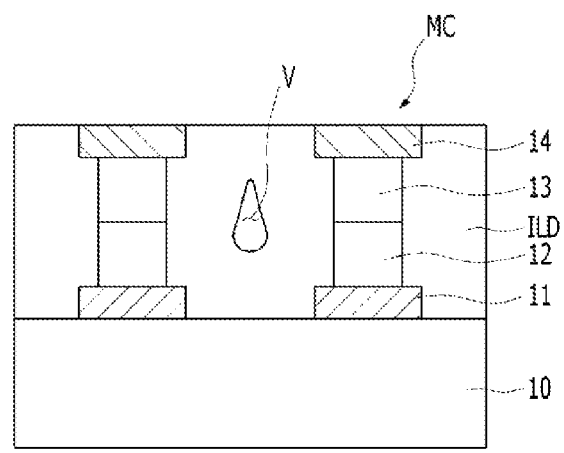
FIG. 1 is a cross-sectional view illustrating a semiconductor device according to a comparative example.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Before describing implementations of the disclosed technology, description will be made of a semiconductor device of a comparative example, a fabrication method thereof, and issues thereof.

FIG. 1 is a cross-sectional view illustrating a semiconductor device according to a comparative example.

Referring to FIG. 1, the semiconductor device of the comparative example may include one or more memory cells MC over a substrate 10 including a certain structure (not shown) formed therein.

Each of the memory cells MC may include a first electrode 11, a second electrode 14, a selection element layer 12, and a variable resistance layer 13. The first electrode 11 is spaced apart from the second electrode 14 in a direction (i.e., vertical direction) perpendicular to a surface of the substrate 10. The selection element layer 12 and the variable resistance layer 13 are sequentially disposed in the vertical direction between the first electrode 11 and the second electrode 14.

The variable resistance layer 13 may switch between different resistance states according to a voltage or a current applied between the first and second electrodes 11 and 14, and hence may store different data corresponding to the different resistance states. The selection element layer 12 may be coupled to the variable resistance layer 13, and control access to the variable resistance layer 13 according to the voltage or the current applied between the first and second electrodes 11 and 14.

An inter-layer dielectric (ILD) layer may be disposed between neighboring memory cells MC in order to electrically isolate the neighboring memory cells MC from each other.

Hereinafter, a method for fabricating the semiconductor device of FIG. 1 will be described briefly.

After the first electrode 11 is formed over the substrate 10, first and second material layers for forming the selection element layer 12 and the variable resistance layer 13, respectively, may be deposited over the first electrode 11, and then a stacked structure of the selection element layer 12 and the variable resistance layer 13 may be obtained by selectively etching the first and second material layers. Subsequently, the memory cell MC may be formed by forming the second electrode 14 over the stacked structure of the selection element layer 12 and the variable resistance layer 13, and then the inter-layer dielectric (ILD) layer may be formed by burying an insulating material in a space between the memory cells MC.

In the semiconductor device of the comparative example, the selection element layer 12 and the variable resistance layer 13 are formed through an etch process, and thus sidewalls of the selection element layer 12 and the variable resistance layer 13 may be damaged during the etch process. In addition, in a process of depositing the insulating material for forming the inter-layer dielectric (ILD) layer on the sidewalls of the selection element layer 12 and the variable resistance layer 13, the sidewalls of the selection element layer 12 and the variable resistance layer 13 may be additionally damaged. Such damage to the sidewalls may deteriorate data storage characteristics, operating characteristics, etc. of the memory cell MC.

Furthermore, when the selection element layer 12 and the variable resistance layer 13 are formed of different materials, a fabrication process may be complicated because the respective material layers may be etched through different etch processes. When a space between the memory cells MC is narrow, a void V may be generated when forming the inter-layer dielectric (ILD) layer. The void V is an empty space that is formed when the insulating material does not fully occupy the space between the memory cells MC. The void V may cause some problems in a fabrication process of the semiconductor device, and thus deteriorate characteristics of the semiconductor device.

Implementations of the disclosed technology provide a semiconductor device whose fabrication process may be simplified and memory cells may have improved characteristics, and provide a method for fabricating the semiconductor device.

FIGS. 2A to 5B are views illustrating a method for fabricating a semiconductor device according to an implementation of the disclosed technology. FIGS. 2A, 3A, 4A, and 5A are plan views, and FIGS. 2B, 3B and 3C, 4B, and 5B are cross-sectional views taken along an A-A' line shown in FIGS. 2A, 3A, 4A, and 5A, respectively.

Figure 2A:
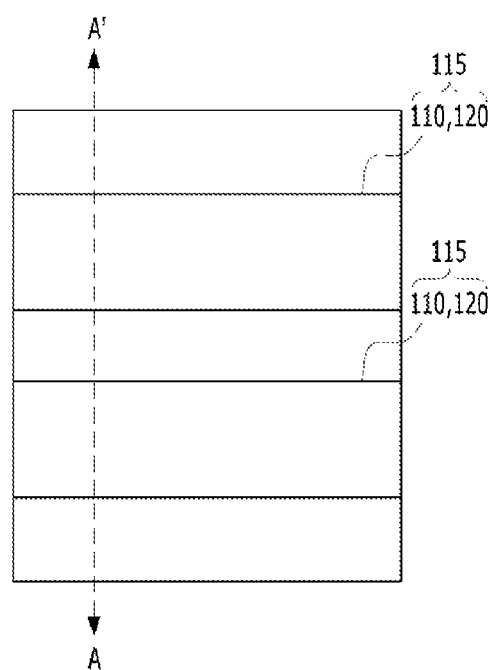
FIGS. 2A-2B, 3A-3C, 4A-4B and 5A-5B are views illustrating a method for fabricating a semiconductor device according to an implementation of the disclosed technology.
Figure 2B:
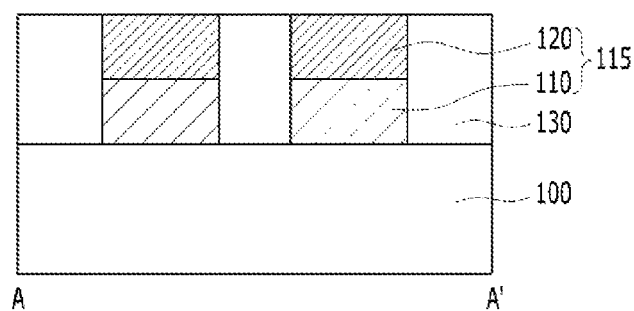

Referring to FIGS. 2A and 2B, first conductive lines 115, which extend in a first direction crossing an A-A' line, may be formed over a substrate 100 that includes a certain structure (not shown) formed therein. Two or more first conductive lines 115 may be arranged to be spaced apart from each other in a second direction parallel to the A-A' line. A first inter-layer dielectric layer 130 fills spaces between the first conductive lines 115.

The first conductive line 115 may be coupled to a lower portion of a first memory cell MC1, which is to be described below, and may supply a voltage or a current to the first memory cell MC1. The first conductive line 115 may have a single-layer structure or a multi-layer structure including any one of various conductive materials, e.g., a metal, such as W, and a metal nitride, such as TiN.

In this implementation, the first conductive line 115 may have a stacked structure of two layers 110 and 120. The lower layer 110 of the first conductive line 115 may function as a word line or a bit line, and the upper layer 120 of the first conductive line 115 may function as a lower electrode which is directly coupled to the lower portion of the first memory cell MC1.

In this implementation, the word line or bit line 110 has the same line shape as the lower electrode 120. In another implementation, if the word line or bit line 110 is electrically coupled to the lower portion of the first memory cell MC1 through the lower electrode 120, the coupled word line or bit line 110 may have a different line shape from the lower electrode 120.

In this implementation, the first conductive line 115 has a line shape extending in the first direction in order to implement a cross-point structure where a memory cell is disposed at a cross point of the first conductive line and another conductive line extending in a direction crossing the first direction. However, implementations are not limited thereto. In other implementations, the first conductive line 115 may include a conductive pattern having any of various shapes instead of the line shape.

In an implementation, the lower electrode 120 may have a single-layer or multi-layer structure including carbon. The lower electrode 120 including carbon may function as a thermal barrier and/or an electrical barrier during a switching operation of the first memory cell MC1.

The first inter-layer dielectric layer 130 may electrically insulate the first conductive lines 115 from each other and have a single-layer structure or a multi-layer structure including any one of various insulating materials such as an oxide, a nitride, and a combination thereof.

In an implementation, the first conductive lines 115 and the first inter-layer dielectric layer 130 may be by depositing conductive materials for forming the lower and upper layers 110 and 120 over the substrate 100 and selectively etching the conductive materials, and then filling spaces between the first conductive lines 115 with insulating materials.

In another implementation, the first conductive lines 115 and the first inter-layer dielectric layer 130 may be formed in the manner of depositing insulating materials for forming the first inter-layer dielectric layer 130 over the substrate 100 and selectively etching the insulating materials to provide a space where the lower and upper layers 110 and 120 of the first conductive line are to be formed, and then burying conductive materials for forming the lower and upper layers 110 and 120 in the space.

Figure 3A:
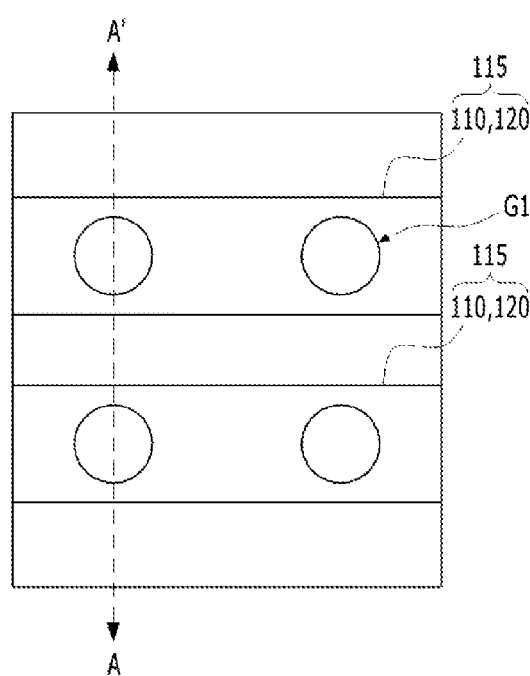
Figure 3B:
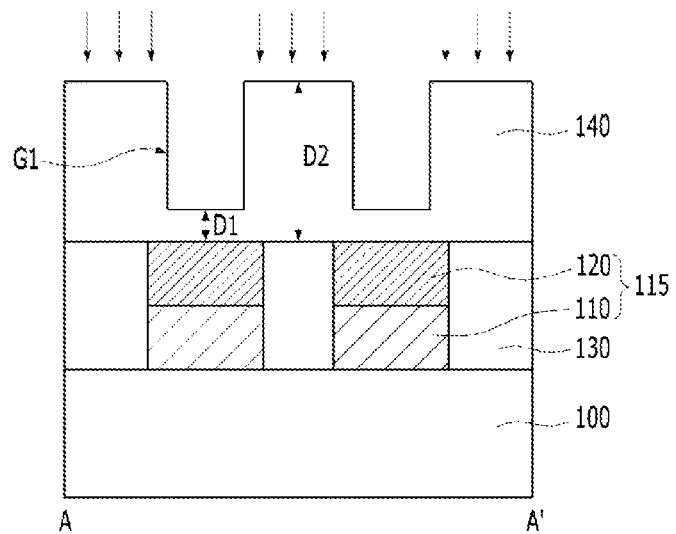
Figure 3C:
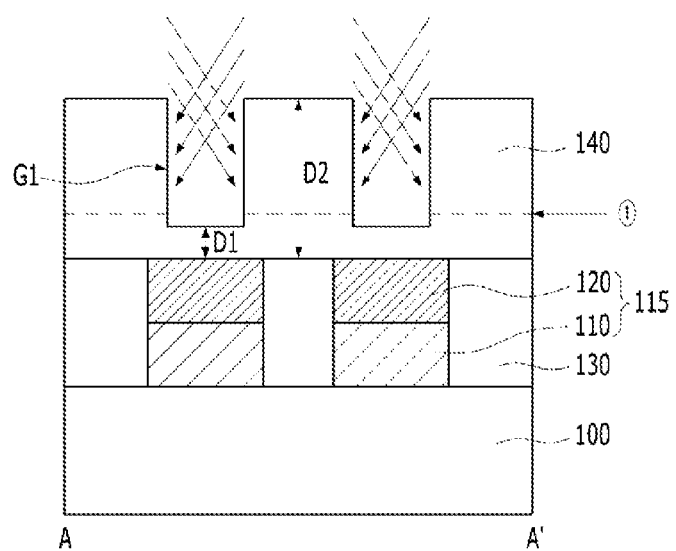

Referring to FIGS. 3A to 3C, a first selection element layer 140 may be formed over the first conductive lines 115 and the first inter-layer dielectric layer 130.

The first selection element layer 140, as a portion of the first memory cell MC1, may control access to a variable resistance layer by being coupled to the variable resistance layer. The first selection element layer 140 may block a current therethrough when an amount of a voltage or current supplied thereto is equal to or smaller than a predetermined threshold value. The first selection element layer 140 may pass a current therethrough when the amount of the supplied voltage or current is greater than the predetermined threshold value, the current increasing sharply in proportion to the amount of the supplied voltage or current.

The first selection element layer 140 may include any of a metal insulator transition (MIT) element such as $NbO_2$ or $TiO_2$, a mixed ion-electron conducting (MIEC) element such as $ZrO_2(Y_2O_3)$, $Bi_2O_3$—BaO, or $(La_2O_3) \times (CeO_2)1-x$, an ovonic threshold switching (OTS) element including a chalcogenide-based material such as $Ge_2Sb_2Te_5$, $As_2Te_3$, $As_2$, or $As_2Se_3$, and a tunneling dielectric layer, which allows tunneling of electrons in a predetermined voltage or current and is formed of any one of various insulating materials such as a silicon oxide, a silicon nitride, a metal oxide, and the like.

The first selection element layer 140 may have a selection element characteristic as described above when a thickness thereof is equal to or smaller than a preset threshold value. Thus, the first selection element layer 140 may have an insulation characteristic of blocking a current flow, regardless of the amount of the supplied voltage or current, when the thickness of the first selection element layer 140 is greater than the preset threshold value. Before forming a first groove, which is to be described below, the first selection element layer 140 may have a thickness D2 greater than the preset threshold value in order to have the insulation characteristic.

Subsequently, one or more first grooves G1 may be formed in the first selection element layer 140 by selectively etching the first selection element layer 140 until a thickness of the first selection element layer 140 directly below the first groove G1 becomes equal to or smaller than the preset threshold value. In other words, a thickness D1 of the part of the first selection element layer 140 directly below the first groove G1 may be equal to or smaller than a maximum thickness having the selection element characteristic. Consequently, a part of the first selection element layer 140, which is disposed directly below the first groove G1, may function as a selection element, while the other parts may function as insulating elements.

When viewed from a plan view, the first grooves G1 may overlap the first conductive lines 115 and be arranged in a matrix shape in the first and second directions. However, as long as at least a portion of each of the first grooves G1 overlaps the first conductive line 115, the shape, number, and arrangement of the grooves G1 may be changed in various ways. When a portion of the first groove G1 overlaps the first conductive line 115, a part of the first selection element layer 140, which is disposed directly below the first groove G1 and overlaps the first conductive line 115, may function as a selection element, and the other parts may function as insulating elements.

As described above, it may be seen that the parts of the first selection element layer 140, which function as the insulating elements, may have the insulation characteristic due to their thicknesses.

Since the first selection element layer 140 and the first grooves G1 are formed before a firing operation to place the first selection element layer 140 under an on-state for the first time is performed, the parts of the first selection element layer 140 that function as the insulating elements, may have a strong insulation characteristic.

After the first selection element layer 140 is formed, the parts of the first selection element layer 140 that function as the insulating elements, may have stronger insulation characteristics when implanted with an impurity (shown by the arrows in FIGS. 3B and 3C), which increases the resistance of the first selection element layer 140.

For example, when an impurity such as $O_2$ and/or Si is implanted into the first selection element layer 140, which includes a chalcogenide-based material, the insulation characteristic of the first selection element layer 140 may increase due to increased resistance of parts where the impurity is implanted. However, implementations are not limited thereto.

In another implementation, any impurity that is likely to further increase the resistance of the first selection element layer 140, may be used. The impurity implantation process may be selectively performed on the first selection element layer 140.

The impurity implantation process may be carried out without implanting the impurity into parts of the first selection element layer 140, which are disposed directly below the first grooves G1. This is because the parts of the first selection element layer 140 directly below the first grooves G1 have to function as selection elements. For example, the impurity implantation process may be carried out in a direction perpendicular to a surface of the substrate 100, while a mask pattern (not shown), which covers regions overlapping the first grooves G1 and exposes the other regions, is disposed over the first selection element layer 140 (refer to FIG. 3B). In this implementation, the depth of the impurity implantation may not be limited.

In another implementation, when the mask pattern is not used, the impurity implantation process may be carried out to implant the impurity into the first selection element layer 140 from an upper part having a first height level to a lower part having second height level indicated by a dotted line ① (refer to FIG. 3C). The first height level is greater than the second height level, and the second height level is equal to or greater than height levels of bottoms of the first grooves G1. In this implementation, the impurity implantation process may be performed with a predetermined acute angle with respect to the surface of the substrate 100 to control the depth of the impurity implantation.

Figure 4A:
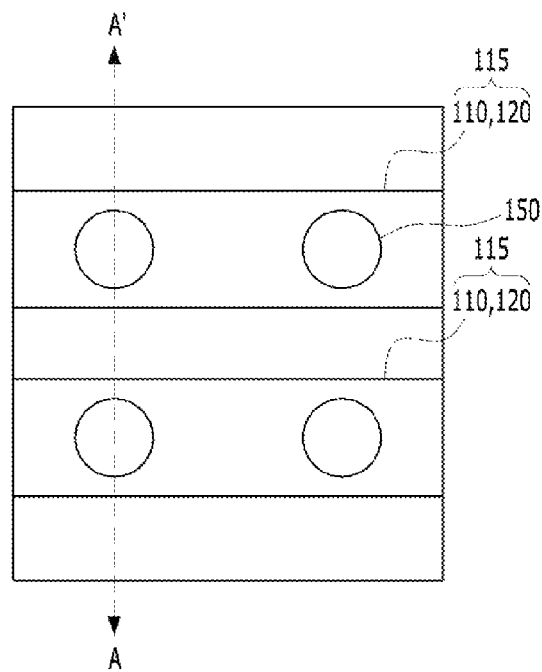
Figure 4B:
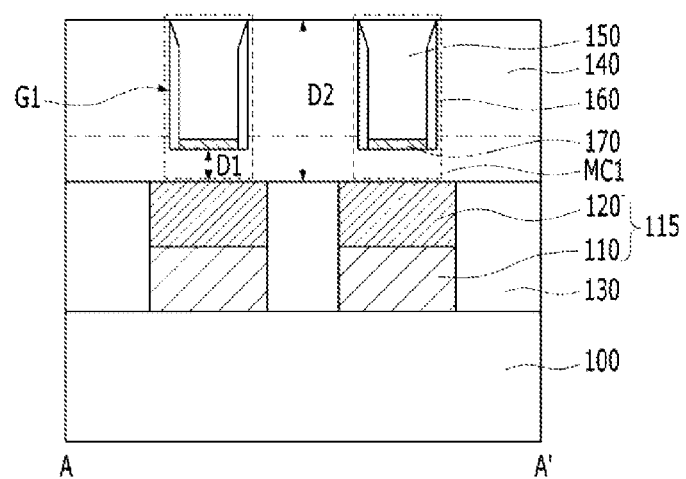

Referring to FIGS. 4A and 4B, a first variable resistance layer 150 buried in the first groove G1 may be formed.

The first variable resistance layer 150 is a portion of the first memory cell MC1. A lower portion of the first variable resistance layer 150 may be electrically coupled to the first selection element layer 140, and an upper portion of the first variable resistance layer 150 may be electrically coupled to various conductive patterns such as an upper electrode which is to be described below. Since the first variable resistance layer 150 has a variable resistance characteristic that switches between different resistance states according to a voltage or a current supplied thereto through the upper portion and the lower portion, the first variable resistance layer 150 may store different data corresponding to the different resistance states.

The first variable resistance layer 150 may have a single-layer structure or a multi-layer structure including any of various variable resistance materials. When the first variable resistance layer 150 has the multi-layer structure including two or more layers, the first variable resistance layer 150 may have a variable resistance characteristic based on a combination of the two or more layers. The variable resistance materials may include a metal oxide such as a transition metal oxide or a perovskite-based material, a phase change material such as a chalcogenide-based material, a ferroelectric material, a ferromagnetic material, and so on, which are used for an RRAM, a PRAM, an FRAM, an MRAM, and so on.

The first variable resistance layer 150 may be formed with a variable resistance material layer and have a sufficient thickness to fill the first grooves G1 shown in FIGS. 3A and 3B (or 3C). A planarization process, e.g., an etch-back process or a chemical mechanical polishing (CMP) process, may be performed on the variable resistance material layer formed to fill the first grooves G1 and cover the first selection element layer 140 until a top surface of the first selection element layer 140 is exposed.

When the first variable resistance layer 150 has the multi-layer structure, a lowest layer of the multi-layer structure is formed over the structure of FIGS. 3A and 3B (or 3C), and an upper portion of the lowest layer may be removed through an etch-back process so that the lowest layer may have a desired thickness buried in a lower portion of the first groove G1. The layers other than the uppermost layer of the multi-layer structure may be sequentially formed over the lowest layer. Subsequently, the uppermost layer of the multi-layer structure may be formed to fully fill the first groove G1, and then the planarization process may be performed on the uppermost layer until the top surface of the first selection element layer 140 is exposed.

Before the first variable resistance layer 150 is formed, a first spacer 160 may be formed on sidewalls of the first selection element layer 140 in the first groove G1. Hence, the first variable resistance layer 150 may be buried in the first groove G1 where the first spacer 160 is formed. The first spacer 160 may separate the first selection element layer 140 from the first variable resistance layer 150 by surrounding sidewalls of the first variable resistance layer 150. In this implementation, since the first spacer 160 is disposed between the first selection element layer 140 and the first variable resistance layer 150 in the first groove G1, when the semiconductor device operates, a portion of the first selection element layer 140 that is disposed over the sidewalls of the first variable resistance layer 150 may be prevented from being damaged due to heat generated while the first variable resistance layer 150 switches between a low resistance state and a high resistance state. The first spacer 160 may be formed of any one of various insulation materials such as an oxide, a nitride, and a combination thereof.

Before forming the first variable resistance layer 150 and after forming the first spacer 160, a first conductive material layer 170 may be formed at the bottom of the first groove G1. Hence, the first variable resistance layer 150 may be buried in the first groove G1 where the first spacer 160 and the first conductive material layer 170 are formed. The first conductive material layer 170 may physically separate the first variable resistance layer 150 from the part of the first selection element layer 140 that is directly below the first groove G1, and may function as an intermediate electrode capable of electrically coupling the first variable resistance layer 150 to the first selection element layer 140. The first conductive material layer 170 may have a single-layer structure or a multi-layer structure including any one of various conductive materials such as a metal and a metal oxide. In an implementation, the first conductive material layer 170 may have a single-layer or multi-layer structure including carbon, thereby functioning as a thermal barrier and/or an electrical barrier.

In this implementation of the disclosed technology, the first spacer 160 and the first conductive material layer 170 are sequentially formed in the first groove G1. However, in another implementation, at least one of the first spacer 160 and the first conductive material layer 170 may be omitted.

As a result of the above fabrication process, the first memory cell MC1 may be formed to include the first variable resistance layer 150 and a portion of the first selection element layer 140 that is electrically coupled to the first variable resistance layer 150 and disposed below the first variable resistance layer 150. The other portions of the first selection element layer 140 having the insulation characteristic may be disposed between the first memory cells MC1, thereby electrically insulating the first memory cells MC1 from each other.

Figure 5A:
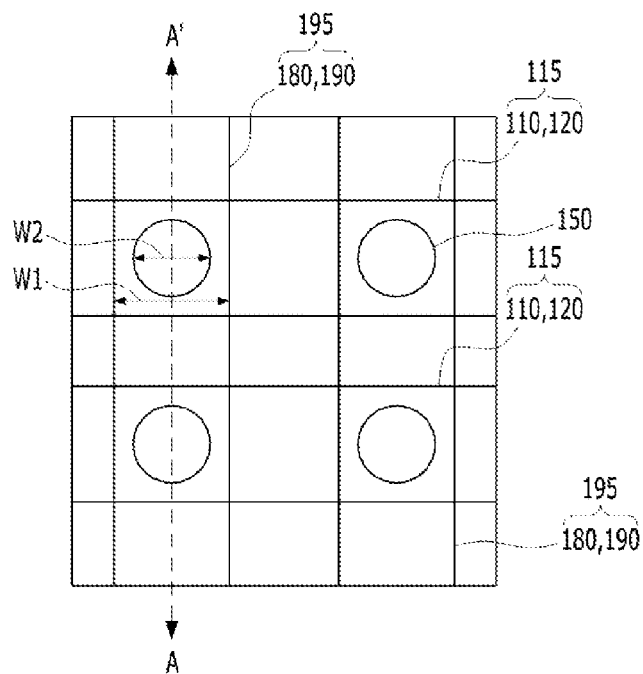
Figure 5B:
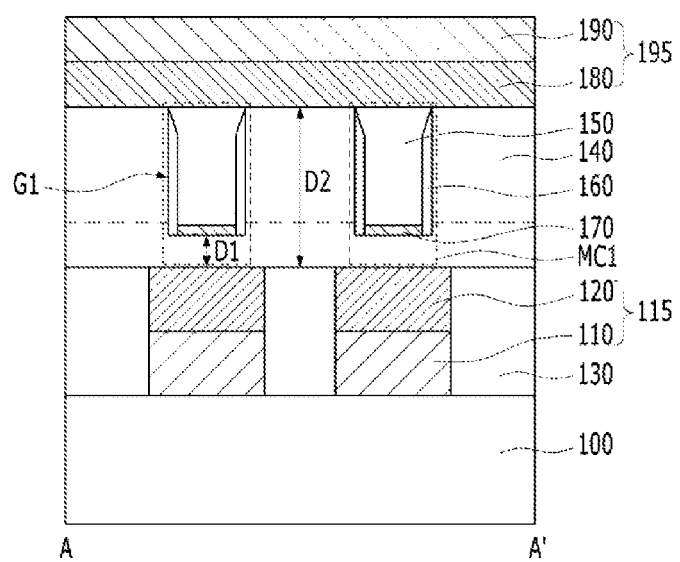

Referring to FIGS. 5A and 5B, second conductive lines 195 extending in the second direction may be formed over the structure of FIGS. 4A and 4B. Two or more second conductive lines 195 may be arranged to be spaced apart from each other in the first direction. Spaces between the two or more second conductive lines 195 may be filled with a second inter-layer dielectric layer (not shown).

The second conductive lines 195 may be coupled to an upper portion of the first memory cell MC1 and supply a voltage or a current to the first memory cell MC1. The second conductive lines 195 may have a single-layer structure or a multi-layer structure including any one of various conductive materials, e.g., a metal, such as W, and a metal nitride, such as TiN. In this implementation illustrated in FIG. 5B, the second conductive line 195 may have a stacked structure of two layers 180 and 190. The upper layer 190 of the second conductive line 195 may function as a bit line when the lower layer 110 of the first conductive line 115 is a word line. On the other hand, the upper layer 190 of the second conductive line 195 may function as a word line when the lower layer 110 of the first conductive line 115 is a bit line. The lower layer 180 of the second conductive line 195 may function as an upper electrode, which is directly coupled to the upper portion of the first memory cell MC1.

In this implementation, the upper layer 190 functioning as the word line or the bit line has the same line shape as the lower layer 180 functioning as the upper electrode. However, implementations are not limited thereto. In another implementation, if the upper layer 190 is electrically coupled to the upper portion of the first memory cell MC1 through the lower layer 180, the upper layer 190 may have a different line shape from the lower layer 180.

In this implementation, the second conductive line 195 has a line shape extending in the second direction in order to implement a cross-point structure where a memory cell is disposed at a cross point of an upper line and a lower line. However, implementations are not limited thereto. In other implementations, the second conductive line 195 may include a conductive pattern having any of various shapes instead of the line shape.

In an implementation, the upper electrode may have a single-layer or multi-layer structure including carbon. The upper electrode including carbon may function as a thermal barrier and/or an electrical barrier during a switching operation of the first memory cell MC1.

The second inter-layer dielectric layer, which is not shown in the drawings, may be formed to electrically insulate the neighboring second conductive lines 195 from each other, and may have a single-layer structure or a multi-layer structure including any one of various insulating materials such as an oxide, a nitride, and a combination thereof.

In an implementation, the second conductive lines 195 and the second inter-layer dielectric layer may be formed in the manner of depositing conductive materials for forming the second conductive lines 195 over the structure shown in FIGS. 4A and 4B and selectively etching the conductive materials, and then filling spaces between etched conductive materials with insulating materials.

In another implementation, the second conductive lines 195 and the second inter-layer dielectric layer may be formed in the manner of depositing insulating materials for forming the second inter-layer dielectric layer over the structure shown in FIGS. 4A and 4B and selectively etching the insulation materials to provide spaces where the second conductive lines 195 are to be formed, and then burying conductive materials for forming the second conductive lines 195 in the spaces.

A width (refer to 'W1' shown in FIG. 5A) of the second conductive lines 195 in the first direction may be larger than a width (refer to 'W2' shown in FIG. 5A) of the first variable resistance layer 150 in the first direction, so that the second conductive lines 195 completely cover the first variable resistance layer 150. This is to prevent the upper portion of the first variable resistance layer 150 from being damaged when the second conductive lines 195 are formed by etching the conductive materials.

Referring back to FIGS. 5A and 5B, the semiconductor device according to an implementation of the disclosed technology may be formed to include the first conductive lines 115 that are disposed over the substrate 100 and extend in the first direction, the second conductive lines 195 that are disposed to be spaced apart from the first conductive lines 115 over the first conductive lines 115 and extend in the second direction, and the first memory cells MC1 disposed at cross points of the first conductive lines 115 and the second conductive lines 195.

The first memory cell MC1 may include the first variable resistance layer 150 and a part of the first selection element layer 140 that is electrically coupled to the first variable resistance layer 150 and disposed below the first variable resistance layer 150. The other parts of the selection element layer 140 may be disposed in spaces between the first memory cells MC1. In other words, the first selection element layer 140 may be formed to surround the sidewalls and bottom of the first variable resistance layer 150. The part of the first selection element layer 140 that is disposed below the first variable resistance layer 150 may have the selection element characteristic, and the other parts of the first selection element layer 140 may have the insulation characteristic.

The spacer 160 may be formed between the sidewall of the first variable resistance layer 150 and the sidewall of the first selection element layer 140 in the first groove G1. The first conductive material layer 170 functioning as the intermediate electrode may be formed between the lower portion of the first variable resistance layer 150 and the part of the first selection element layer 140 that is directly below the first variable resistance layer 150 in the first groove G1.

The semiconductor device fabricated as described above may have the following advantages.

Since a memory cell is formed by burying a variable resistance layer in a groove generated by etching a portion of a selection element layer, an etch process of etching the variable resistance layer is omitted. As a result, it is possible to prevent sidewalls of the memory cell from being damaged during an etch process, unlike the comparative example of the disclosed technology. In addition, since the variable resistance layers of the memory cells are insulated from each other by the selection element layer that has been formed before the variable resistance layers are formed, an additional process of depositing an inter-layer dielectric layer in spaces between the variable resistance layers of the memory cells may not be required. Therefore, it is also possible to prevent the side walls of the memory cell from being damaged by a deposition process. Since the deposition process of forming the inter-layer dielectric layer is omitted, the generation of a void may be fundamentally prevented. Further, since oxidative materials that may oxidize the selection element layer are not included in the inter-layer dielectric layer, the selection element layer may be prevented from being oxidized. Consequently, characteristics of the memory cell may be improved.

In addition, since the etch process of etching the variable resistance layer included in the memory cell and the process of forming the inter-layer dielectric layer between the memory cells are omitted as described above, the fabrication process of the semiconductor device may be simplified.

Although it is described in the implementations of FIGS. 2A to 5B that the first variable resistance layer 150 is buried in the entire first groove G1 so that a top surface of the first variable resistance layer 150 is leveled with a top surface of the first selection element layer 140, the first variable resistance layer 150 may be buried in a portion of the first groove G1 in another implementation, which will be described below with reference to FIG. 6.

Figure 6:
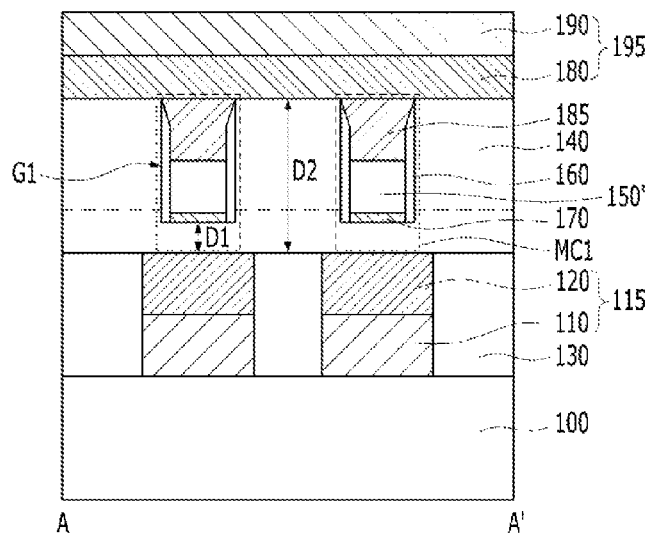
FIG. 6 is a cross-sectional view illustrating a semiconductor device according to another implementation of the disclosed technology.

FIG. 6 is a cross-sectional view illustrating a semiconductor device according to another implementation of the disclosed technology. Detailed descriptions of substantially the same structures in FIG. 6 as those described in the aforementioned implementations are omitted.

Referring to FIG. 6, a first variable resistance layer 150' may be buried only in a lower portion of the first groove G1. For this purpose, after a variable resistance material is formed over the first selection element layer 140 where the first groove G1 is formed so as to fill the first groove G1, the first variable resistance layer 150' may be formed by etching back an upper portion of the variable resistance material by a desired depth so that the variable resistance material remains only in the lower portion of the first groove G1.

After that, a second conductive material layer 185 may be buried in the remaining portion of the first groove G1 where the first variable resistance layer 150' is not formed. The second conductive material layer 185 may be formed by forming a conductive material to cover the resultant structure including the first groove G1 in which the first variable resistance layer 150' is formed and then performing a planarization process on the conductive material until the top surface of the first selection element layer 140 is exposed.

The second conductive material layer 185 may function as the upper electrode along with the lower layer 180 of the second conductive line 195. Hence, the second conductive material layer 185 may include substantially the same material as the lower layer 180, e.g., a metal, a metal nitride, or carbon. In another implementation, the second conductive material layer 185 may function as the upper electrode alone when the lower layer 180 is omitted from the second conductive line 195. Since the second conductive material layer 185 is buried in the first groove G1, the second conductive material layer 185 may have sidewalls aligned with sidewalls of the first variable resistance layer 150'.

FIGS. 2A to 5B illustrate a cross-point structure where one layer of a memory cell is disposed between two lines that are disposed above and below the layer in a vertical direction and extend in different directions crossing each other.

In another implementation, three or more lines may be arranged in the vertical direction, and any one line of the lines may extend in a first direction crossing the other lines, the other lines extending in a second direction and arranged just above and just below the line. The first and second directions are parallel to a surface of a substrate, but they are not parallel to each other. In other words, a first line extending in the first direction and a second line extending in the second direction may be alternately arranged in the vertical direction. In this implementation, a memory cell may be arranged in between two neighboring lines in the vertical direction. Hence, the cross-point structure where the memory cell including two or more layers is disposed may be obtained. Detailed descriptions thereof are provided below with reference to FIGS. 7A and 7B.

Figure 7A:
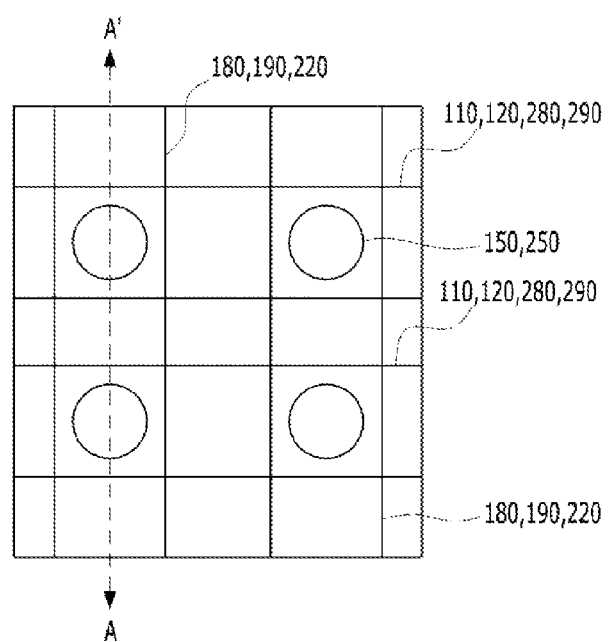
FIGS. 7A and 7B are views illustrating a semiconductor device according to yet another implementation of the disclosed technology.
Figure 7B:
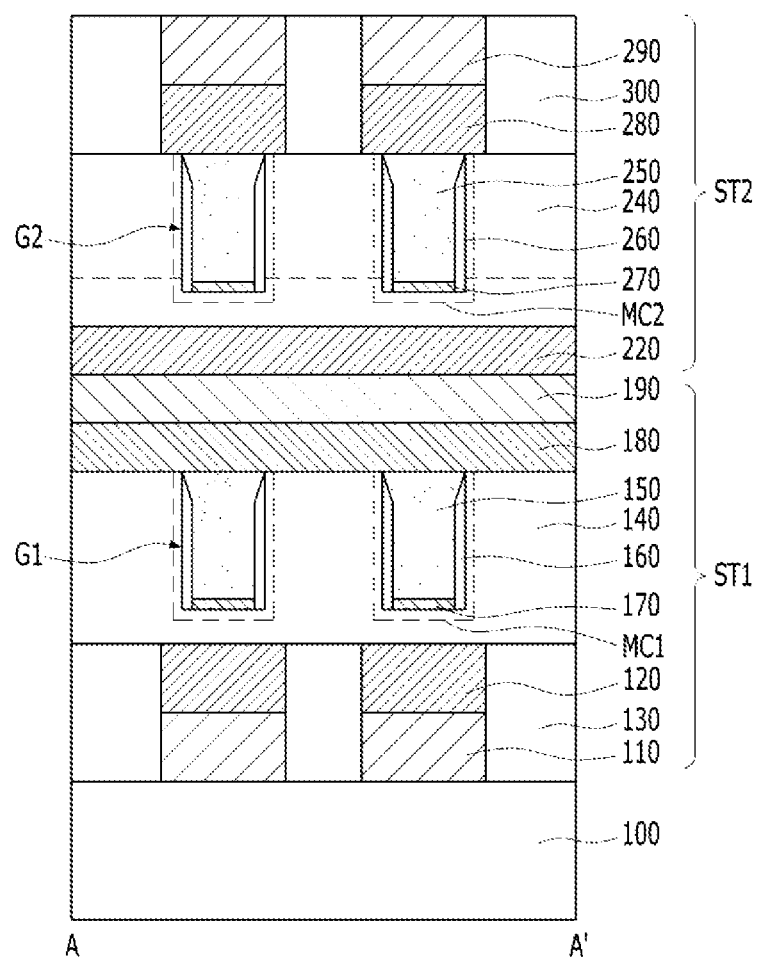

FIGS. 7A and 7B are views illustrating a semiconductor device according to yet another implementation of the disclosed technology. Detailed descriptions of substantially the same structures in FIGS. 7A and 7B as those described in the aforementioned implementations are omitted.

Referring to FIGS. 7A and 7B, the semiconductor device may include a first stack ST1 and a second stack ST2 that are vertically stacked over a substrate 100. The first stack ST1 may include first conductive lines, second conductive lines, and first memory cells MC1. The first conductive line includes two layers 110 and 120, which are disposed over the substrate 100 and extend in a first direction parallel to a surface of the substrate 100. The second conductive line is spaced apart from the first conductive line in a vertical direction perpendicular to the surface of the substrate 100, and includes three layers 180, 190, and 220, which extend in a second direction that is parallel to the surface of the substrate 100 and that crosses the first direction. The first memory cell MC1 is disposed at a cross point of the first conductive line and the second conductive line.

The second stack ST2 may include the second conductive lines, third conductive lines, and second memory cells MC2. The third conductive line includes two layers 280 and 290, which are disposed to be spaced apart from the second conductive line over the second conductive line. The second memory cell MC2 is disposed at a cross point of the second conductive line and the third conductive line. The first stack ST1 and the second stack ST2 may share the second conductive lines including the three layers 180, 190 and 220.

The first stack ST1 may have a structure that is substantially the same as the structure shown in FIGS. 5A and 5B, except for the second conductive lines.

The second conductive line may include the lower layer 180 capable of functioning as an upper electrode of the first memory cell MC1, the intermediate layer 190 capable of functioning as a word line or a bit line, and an upper layer 220 capable of functioning as a lower electrode of the second memory cell MC2. The lower layer 180, the intermediate layer 190, and the upper layer 220 of the second conductive line may be patterned together. In other words, the lower layer 180, the intermediate layer 190, and the upper layer 220 may be etched using a single mask, thereby having sidewalls which are aligned to one another. However, in another implementation, the lower layer 180 and/or the upper layer 220 may be patterned differently from the intermediate layer 190, and thus may have a different shape from that of the intermediate layer 190.

An inter-layer insulating material (not shown) may fill a space between the neighboring second conductive lines.

The second stack ST2 may have substantially the same structure as the first stack ST1, except that directions of a lower line and an upper line are opposite to those of the first stack ST1.

To be specific, the second memory cell MC2 of the second stack ST2 may include a second variable resistance layer 250 and a second selection element layer 240. The second selection element layer 240 may include a first part, which is disposed directly below the second variable resistance layer 250 and is electrically coupled to the second variable resistance layer 250. The second selection element layer 240 may further include a second part that is disposed between the neighboring second memory cells MC2. In other words, the second selection element layer 240 may be formed to surround sidewalls and a bottom of the second variable resistance layer 250. The first part of the second selection element layer 240 may have a selection element characteristic, and the second part of the second selection element layer 240 may have an insulation characteristic.

The second memory cell MC2 may further include a second spacer 260 and a third conductive material layer 270. The second spacer 260 is formed between the sidewalls of the second variable resistance layer 250 and the second part of the second selection element layer 240. The third conductive material layer 270 may be formed between the bottom of the second variable resistance layer 250 and the first part of the second selection element layer 240, and may function as an intermediate electrode.

The lower layer 280 of the third conductive line may function as an upper electrode of the second memory cell MC2, and the upper layer 290 of the third conductive line may function as a word line or a bit line. A third inter-layer dielectric layer 300 may be buried in a space between the neighboring third conductive lines.

In the aforementioned structure, when the intermediate layer 190 of the second conductive line functions as a common bit line of the first and second stacks ST1 and ST2, the lower layer 110 of the first conductive line and the upper layer 290 of the third conductive line may function as a word line of the first stack ST1 and a word line of the second stack ST2, respectively. On the other hand, when the intermediate layer 190 of the second conductive line functions as a common word line of the first and second stacks ST1 and ST2, the lower layer 110 of the first conductive line and the upper layer 290 of the third conductive line may function as a bit line of the first stack ST1 and a bit line of the second stack ST2, respectively.

Although the implementation shown in FIGS. 7A and 7B discloses only two stacks ST1 and ST2 that are stacked vertically, three or more stacks may be stacked in the same manner.

FIGS. 8 to 11 are cross-sectional views illustrating a method for fabricating a semiconductor device according to yet another implementation of the disclosed technology. Detailed descriptions of substantially the same structures in FIGS. 8 to 11 as those described in the aforementioned implementation are omitted.

Figure 8:
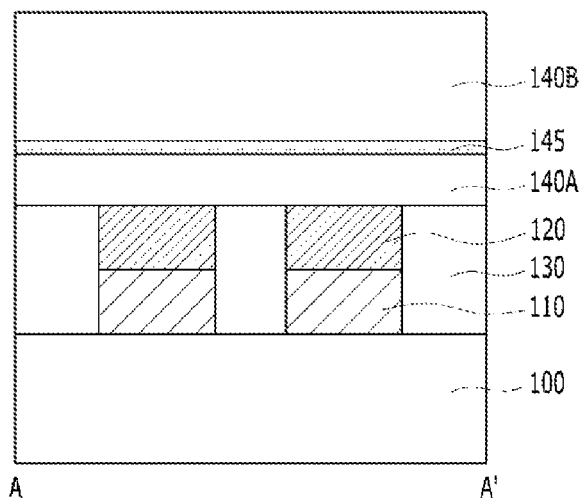
FIGS. 8 to 11 are cross-sectional views illustrating a method for fabricating a semiconductor device according to yet another implementation of the disclosed technology.

Referring to FIG. 8, first conductive lines including two layers 110 and 120 and a first inter-layer dielectric layer 130 may be formed over a substrate 100.

Subsequently, a first sub-selection element layer 140A, an etch stop layer 145, and a second sub-selection element layer 140B may be formed over the two layers 110 and 120 of the first conductive lines and the first inter-layer dielectric layer 130.

The first sub-selection element layer 140A and the second sub-selection element layer 140B may be formed with substantially the same material as the selection element layer 140 described above.

The etch stop layer 145 may carry out an etch stop function in an etch process that is performed on the second sub-selection element layer 140B to form a first groove G1 which is to be described below. The etch stop layer 145 may include any of various insulating materials or any of semiconductor materials, and the etch stop layer 145 may have a different etch rate from the first sub-selection element layer 140A and the second sub-selection element layer 140B.

The first sub-selection element layer 140A may have a thickness that corresponds to the thickness D1 described above. The sum of thicknesses of the first sub-selection element layer 140A, the etch stop layer 145, and the second sub-selection element layer 140B may correspond to the thickness D2 described above.

Figure 9:
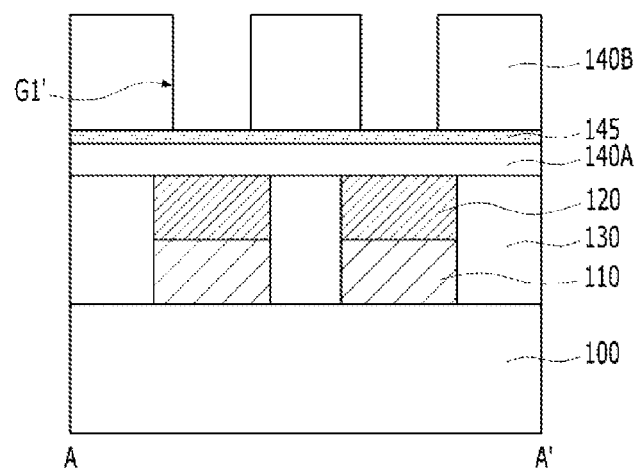

Referring to FIG. 9, one or more initial first grooves G1' may be formed by selectively etching the second sub-selection element layer 140B. The etch stop layer 145 may carry out the etch stop function in the etch process that is performed on the second sub-selection element layer 140B.

Figure 10:
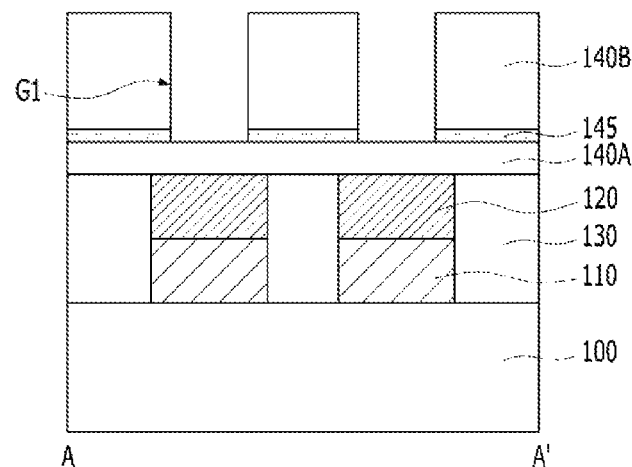
Figure 11:
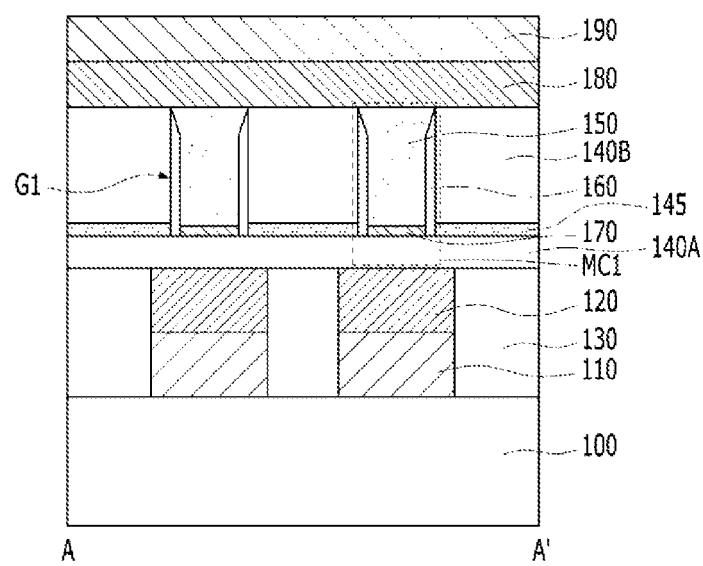

Referring to FIG. 10, the first groove G1 may be formed by removing a portion of the etch stop layer 145, which is exposed when forming the initial first groove G1'. Hence, the first sub-selection element layer 140A having the thickness D1, which is enough for the first sub-selection element layer 140A to function as a selection element, may exist below the first groove G1. A bottom of the first groove G1 may be level with a bottom of the etch stop layer 145.

Subsequent processes may be substantially the same as those described in the aforementioned implementations. For example, referring to FIG. 11, after the first groove G1 is formed, a first spacer 160, a first conductive material layer 170, and a first variable resistance layer 150 may be sequentially formed, and then second conductive lines, including two layers 180 and 190, may be formed over the resultant structure that includes the second sub-selection element layer 140B and the first variable resistance layer 150.

As is apparent from the above descriptions, in the semiconductor device and the method for fabricating the same in accordance with the implementation, it is possible to consistently secure characteristics of the memory cell by uniformly controlling a depth of the first groove G1 using the etch stop layer 145. In addition, it is possible to simplify the fabrication process.

The above and other memory circuits or semiconductor devices based on the disclosed technology can be used in a range of devices or systems. FIGS. 12-16 provide some examples of devices or systems that can implement the memory circuits disclosed herein.

Figure 12:
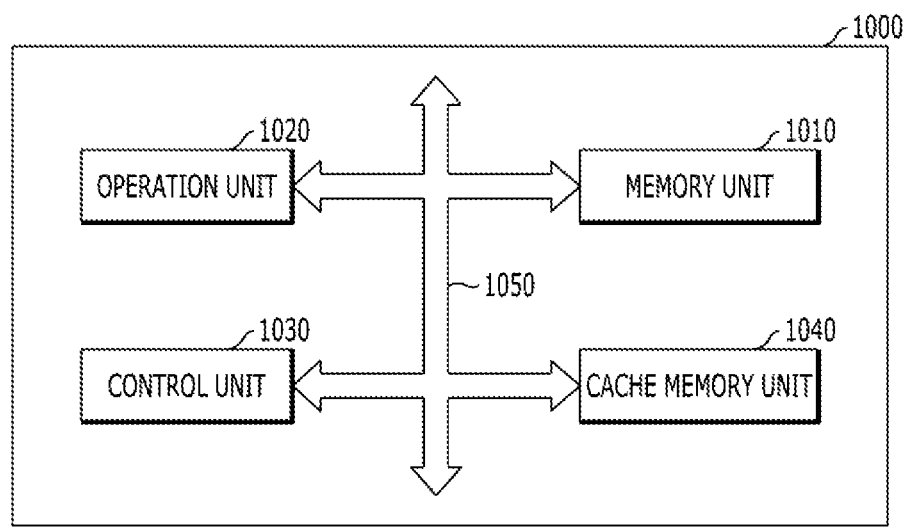
FIG. 12 is an example of configuration diagram of a microprocessor implementing memory circuitry based on the disclosed technology.

FIG. 12 is an example of configuration diagram of a microprocessor implementing memory circuitry based on the disclosed technology.

Referring to FIG. 12, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a first conductive pattern disposed over a substrate; a first selection element layer disposed over the first conductive pattern and having one or more first grooves therein, the first grooves overlapping the first conductive pattern; a first variable resistance layer whose sidewalls and bottom are surrounded by the first selection element layer, the first variable resistance layer being buried in the first groove; and a second conductive pattern that overlaps the first variable resistance layer and is disposed over the first variable resistance layer. Through this, fabricating processes may be simplified and memory cell characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 13:
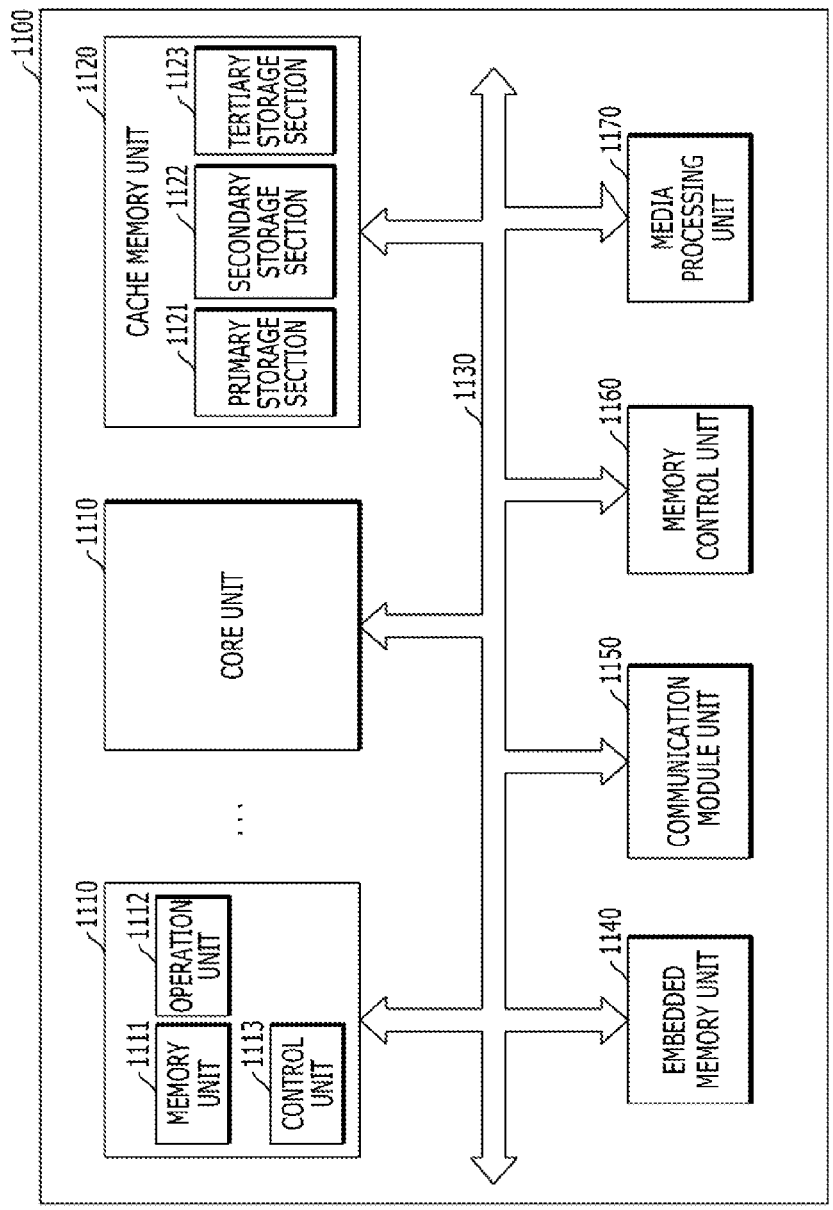
FIG. 13 is an example of configuration diagram of a processor implementing memory circuitry based on the disclosed technology.

FIG. 13 is an example of configuration diagram of a processor implementing memory circuitry based on the disclosed technology.

Referring to FIG. 13, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first conductive pattern disposed over a substrate; a first selection element layer disposed over the first conductive pattern and having one or more first grooves therein, the first grooves overlapping the first conductive pattern; a first variable resistance layer whose sidewalls and bottom are surrounded by the first selection element layer, the first variable resistance layer being buried in the first groove; and a second conductive pattern that overlaps the first variable resistance layer and is disposed over the first variable resistance layer. Through this, fabricating processes may be simplified and memory cell characteristics of the cache memory unit 1120 may be improved. As a consequence, operating characteristics of the processor 1100 may be improved.

Although it was shown in FIG. 13 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 14:
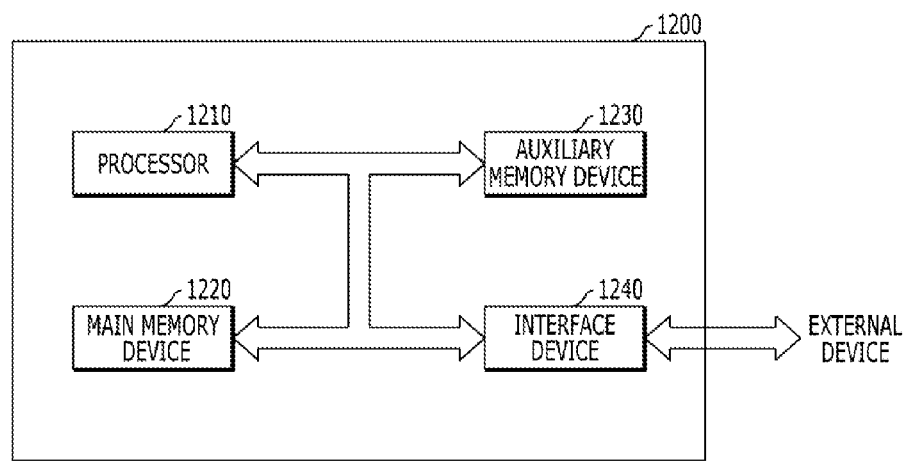
FIG. 14 is an example of configuration diagram of a system implementing memory circuitry based on the disclosed technology.

FIG. 14 is an example of configuration diagram of a system implementing memory circuitry based on the disclosed technology.

Referring to FIG. 14, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a first conductive pattern disposed over a substrate; a first selection element layer disposed over the first conductive pattern and having one or more first grooves therein, the first grooves overlapping the first conductive pattern; a first variable resistance layer whose sidewalls and bottom are surrounded by the first selection element layer, the first variable resistance layer being buried in the first groove; and a second conductive pattern that overlaps the first variable resistance layer and is disposed over the first variable resistance layer. Through this, fabricating processes may be simplified and memory cell characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a first conductive pattern disposed over a substrate; a first selection element layer disposed over the first conductive pattern and having one or more first grooves therein, the first grooves overlapping the first conductive pattern; a first variable resistance layer whose sidewalls and bottom are surrounded by the first selection element layer, the first variable resistance layer being buried in the first groove; and a second conductive pattern that overlaps the first variable resistance layer and is disposed over the first variable resistance layer. Through this, fabricating processes may be simplified and memory cell characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 15) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 15:
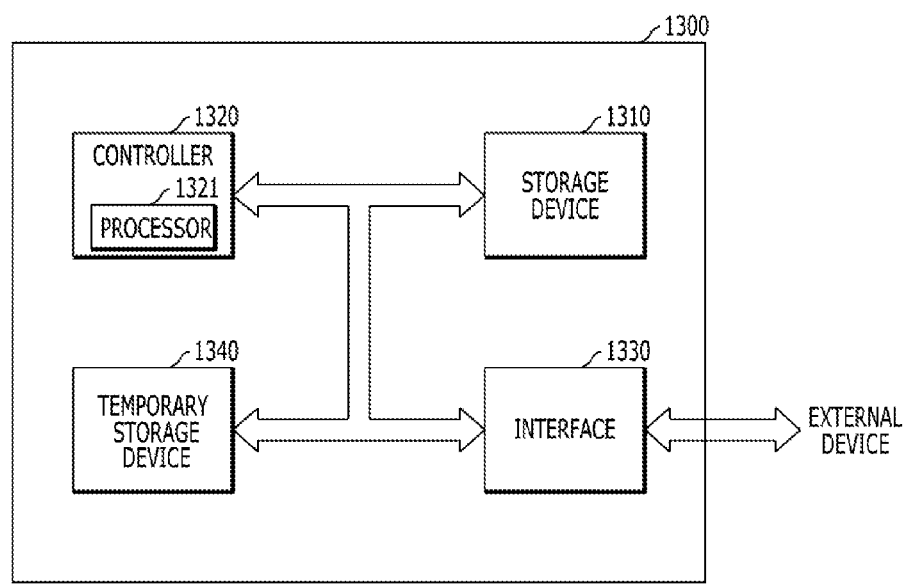
FIG. 15 is an example of configuration diagram of a data storage system implementing memory circuitry based on the disclosed technology.

FIG. 15 is an example of configuration diagram of a data storage system implementing memory circuitry based on the disclosed technology.

Referring to FIG. 15, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a first conductive pattern disposed over a substrate; a first selection element layer disposed over the first conductive pattern and having one or more first grooves therein, the first grooves overlapping the first conductive pattern; a first variable resistance layer whose sidewalls and bottom are surrounded by the first selection element layer, the first variable resistance layer being buried in the first groove; and a second conductive pattern that overlaps the first variable resistance layer and is disposed over the first variable resistance layer. Through this, fabricating processes may be simplified and memory cell characteristics of the temporary storage device 1340 may be improved. As a consequence, operating characteristics and data storage characteristics of the data storage system 1300 may be improved.

Figure 16:
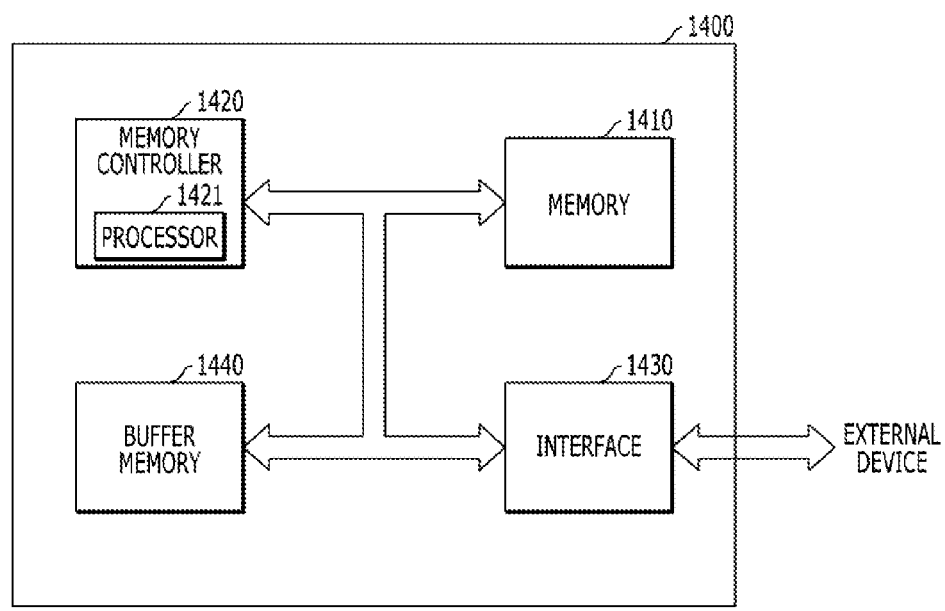
FIG. 16 is an example of configuration diagram of a memory system implementing memory circuitry based on the disclosed technology.

FIG. 16 is an example of configuration diagram of a memory system implementing memory circuitry based on the disclosed technology.

Referring to FIG. 16, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first conductive pattern disposed over a substrate; a first selection element layer disposed over the first conductive pattern and having one or more first grooves therein, the first grooves overlapping the first conductive pattern; a first variable resistance layer whose sidewalls and bottom are surrounded by the first selection element layer, the first variable resistance layer being buried in the first groove; and a second conductive pattern that overlaps the first variable resistance layer and is disposed over the first variable resistance layer. Through this, fabricating processes may be simplified and memory cell characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first conductive pattern disposed over a substrate; a first selection element layer disposed over the first conductive pattern and having one or more first grooves therein, the first grooves overlapping the first conductive pattern; a first variable resistance layer whose sidewalls and bottom are surrounded by the first selection element layer, the first variable resistance layer being buried in the first groove; and a second conductive pattern that overlaps the first variable resistance layer and is disposed over the first variable resistance layer. Through this, fabricating processes may be simplified and memory cell characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 12-16 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device including a semiconductor memory, the semiconductor memory comprising:
   a first conductive pattern disposed over a substrate;
   a first selection element layer disposed over the first conductive pattern and having one or more first grooves therein, the first grooves overlapping the first conductive pattern;
   a first variable resistance layer whose sidewalls and bottom are surrounded by the first selection element layer, the first variable resistance layer being buried in the first groove;
   a second conductive pattern that overlaps the first variable resistance layer and is disposed over the first variable resistance layer; and
   a first conductive material layer disposed between the bottom of the first variable resistance layer and a part of the first selection element layer that is disposed directly below the first groove.

2. The electronic device according to claim 1, wherein the first selection element layer includes a first part and a second part other than the first part, the first part being disposed directly below the first groove and having a selection element characteristic, the second part having an insulation characteristic.

3. The electronic device according to claim 1, wherein the first selection element layer includes a first part and a second part other than the first part, the first part being disposed directly below the first groove and having a smaller thickness than a thickness of the second part.

4. The electronic device according to claim 1, wherein the semiconductor memory further includes an insulating spacer that is disposed in the first groove between the sidewalls of the first variable resistance layer and sidewalls of the first selection element layer.

5. The electronic device according to claim 1, wherein the first conductive pattern includes a first conductive line extending in a first direction, and
   the second conductive pattern includes a second conductive line extending in a second direction crossing the first direction, the first and second directions being parallel to a surface of the substrate, and
   the first groove overlaps a cross-point region of the first conductive line and the second conductive line.

6. The electronic device according to claim 1, wherein at least one of the first and second conductive patterns includes carbon.

7. The electronic device according to claim 1, wherein the first conductive material layer includes carbon.

8. The electronic device according to claim 1, wherein the first variable resistance layer is partially buried in a lower portion of the first groove, and
   wherein the semiconductor memory further includes a second conductive material layer that is directly disposed on the first variable resistance layer, the second conductive material layer filling a remaining portion of the first groove where the first variable resistance layer is formed.

9. The electronic device according to claim 8, wherein the second conductive material layer includes carbon.

10. The electronic device according to claim 1, wherein the second conductive pattern has a width of completely covering an upper side of the first variable resistance layer.

11. The electronic device according to claim 1, wherein the semiconductor memory further includes:
a second selection element layer disposed over the second conductive pattern and having one or more second grooves, the second grooves overlapping the second conductive pattern;
a second variable resistance layer whose side-walls and bottom are surrounded by the second selection element layer, the second variable resistance layer being buried in the second groove; and
a third conductive pattern that overlaps the second variable resistance layer and is disposed over the second variable resistance layer.

12. The electronic device according to claim 11, wherein the first conductive pattern and the third conductive pattern include a first conductive line and a third conductive line extending in a first direction, respectively, and
the second conductive pattern includes a second conductive line extending in a second direction crossing the first direction, the first and second directions being parallel to a surface of the substrate, and
the first groove overlaps a cross-point region of the first conductive line and the second conductive line, and
the second groove overlaps a cross-point region of the second conductive line and the third conductive line.

13. The electronic device according to claim 1, wherein the first selection element layer includes a first sub-selection element layer and a second sub-selection element layer disposed over the first sub-selection element layer,
wherein the semiconductor memory further includes a material layer, the material layer being disposed between the first sub-selection element layer and the second sub-selection element layer and having a different etch rate from the first sub-selection element layer and the second sub-selection element layer, and
wherein sidewalls of the first groove are surrounded by the material layer and the second sub-selection element layer, and a top surface of the first sub-selection element layer is exposed in the first groove.

14. The electronic device according to claim 13, wherein a first part of the first sub-selection element layer has a selection element characteristic, and a second part of the first sub-selection element layer and the second sub-selection element layer have an insulation characteristic, the first part overlapping the first groove, and the second part being other than the first part.

15. An electronic device including a semiconductor memory, the semiconductor memory comprising:
a first conductive pattern disposed over a substrate;
a first selection element layer disposed over the first conductive pattern and having one or more first grooves therein, the first grooves overlapping the first conductive pattern;
a first variable resistance layer whose sidewalls and bottom are surrounded by the first selection element layer, the first variable resistance layer being buried in the first groove;
a second conductive pattern that overlaps the first variable resistance layer and is disposed over the first variable resistance layer,
wherein the first selection element layer includes a first part and a second part other than the first part, the first part being disposed directly below the first groove, the second part further including an impurity that increases a resistance of the second part of the first selection element layer.

16. The electronic device according to claim 15, wherein the impurity exists in a region of the second part, a bottom of the second part having a height level that is equal to or greater than a height level of a bottom of the first groove.

17. The electronic device according to claim 15, wherein the first selection element layer includes a chalcogenide-based material, and the impurity includes oxygen or silicon.

18. An electronic device including a semiconductor memory, the semiconductor memory comprising:
a first conductive pattern disposed over a substrate;
a selection element layer disposed over the first conductive pattern and having a groove therein, the groove overlapping the first conductive pattern;
a variable resistance layer buried in the first groove; and
a second conductive pattern that overlaps the variable resistance layer and is disposed over the variable resistance layer,
wherein the selection element layer includes a first part between a bottom of variable resistance layer and the first conductive pattern, and a second part surrounding sidewalls of the variable resistance layer, and
wherein the first part of the selection element layer has a selection element characteristic passing a current, and the second part of the selection element layer has an insulation characteristic blocking the current.

19. The electronic device according to claim 18, wherein the first part of the selection element layer passes the current when a supply voltage is greater than a threshold value.

20. The electronic device according to claim 18, wherein the selection element layer is a single layer, and the first conductive pattern and the variable resistance layer are spaced apart by the first part of the selection element layer.

* * * * *